(12) United States Patent
Yokota

(10) Patent No.: US 9,144,158 B2
(45) Date of Patent: Sep. 22, 2015

(54) REFLOW SOLDERING APPARATUS AND METHOD

(75) Inventor: Yatsuharu Yokota, Tokyo (JP)

(73) Assignee: Yokota Technica, Tokyo (JP)

( * ) Notice: Subject to any disclaimer, the term of this patent is extended or adjusted under 35 U.S.C. 154(b) by 118 days.

(21) Appl. No.: 13/993,188

(22) PCT Filed: Dec. 16, 2011

(86) PCT No.: PCT/JP2011/079146
§ 371 (c)(1),
(2), (4) Date: Jun. 11, 2013

(87) PCT Pub. No.: WO2012/086533
PCT Pub. Date: Jun. 28, 2012

(65) Prior Publication Data
US 2013/0263445 A1    Oct. 10, 2013

(30) Foreign Application Priority Data

Dec. 20, 2010  (JP) ................. 2010-283093

(51) Int. Cl.
*H05K 3/34* (2006.01)
*H05K 3/30* (2006.01)
*B23K 1/00* (2006.01)
*B23K 1/008* (2006.01)

(52) U.S. Cl.
CPC ............ *H05K 3/303* (2013.01); *B23K 1/008* (2013.01); *B23K 1/0016* (2013.01); *H05K 3/3494* (2013.01); *H05K 2203/085* (2013.01); *Y10T 29/49144* (2015.01); *Y10T 29/53174* (2015.01)

(58) Field of Classification Search
USPC ........... 29/739, 743, 751, 753, 822, 839, 840, 29/843, 860, 878; 219/388, 400; 228/42, 228/43, 180.1, 245, 246
See application file for complete search history.

(56) References Cited

U.S. PATENT DOCUMENTS

| | | | | |
|---|---|---|---|---|
| 3,755,890 A | * | 9/1973 | Klehm, Jr. | 29/846 |
| 3,953,663 A | * | 4/1976 | Kelhm, Jr. | 174/262 |
| 4,392,049 A | * | 7/1983 | Bentley et al. | 219/401 |
| 4,909,430 A | * | 3/1990 | Yokota | 228/102 |

(Continued)

FOREIGN PATENT DOCUMENTS

| | | |
|---|---|---|
| JP | 3258458 | 11/1991 |
| JP | 6226484 | 8/1994 |

(Continued)

OTHER PUBLICATIONS

International Search Report for PCT/JP2011/079146 dated Mar. 7, 2012.

*Primary Examiner* — Paul D Kim

(74) *Attorney, Agent, or Firm* — Andrus Intellectual Property Law, LLP

(57) ABSTRACT

The apparatus of the present application reduces poor soldering having gas left there at when soldering. in a reflow soldering apparatus for soldering electronic components mounted on a board by heated atmospheric gas while transferring the printed circuit board with the electronic components within preheating chambers and reflow chambers. Reflow chamber in order within a furnace, a pressure reducing chamber capable of reducing a pressure of the atmospheric gas is installed in the reflow chamber where the heated atmospheric gas circulates in the chamber, and gas involved in a heated and melted soldering part on the printed circuit board is removed at the pressure reducing chamber.

8 Claims, 9 Drawing Sheets

(56) References Cited

U.S. PATENT DOCUMENTS

| | | | |
|---|---|---|---|
| 6,423,945 B1 * | 7/2002 | Yokota | 219/388 |
| 6,437,289 B1 * | 8/2002 | Yokota | 219/388 |
| 2007/0170227 A1 * | 7/2007 | Ohno et al. | 228/101 |

FOREIGN PATENT DOCUMENTS

| | | |
|---|---|---|
| JP | 2004181483 | 7/2004 |
| JP | 2009226456 | 10/2009 |

* cited by examiner

REFLOW SOLDERING APPARATUS AND METHOD

CROSS REFERENCE TO RELATED APPLICATION

The present application is the U.S. national stage application of International Application PCT/JP2011/079146, filed Dec. 16, 2011, which international application was published on Jun. 28, 2012 as International Publication WO 2012/086533. The International Application claims priority of Japanese Patent Application 2010-283093, filed Dec. 20, 2010, the contents of which are incorporated herein by reference in their entireties.

BACKGROUND OF INVENTION

This invention relates to a reflow soldering apparatus and method, particularly, comprising a pressure reducing chamber capable of reducing gas at the soldering part when soldering.

TECHNICAL FIELD OF INVENTION

A reflow soldering apparatus is operated in such a way that heated gas is blown against a board with a electronic components mounted thereon, for example, to solder the electronic components to the board while the board is being transferred by conveyors within a furnace where a preheating chamber and a reflow chamber are arranged in sequence.

RELATED ART

Patent Documents

Patent Document 1: Patent unexamined Publication 2000-188467

DETAILED DESCRIPTION OF INVENTION

Problems to be Solved by Invention

In the aforesaid reflow soldering, there is a bad case to be soldered, due to increase the void at the soldering part when soldering.

The purpose of this invention is to provide the apparatus and method in which it is possible to reduce poor soldering having gas left thereat when soldering.

Means to Solve the Problems

In a reflow soldering apparatus for soldering electronic components mounted on a board by circulating heated atmospheric gas in a furnace while transferring the board with the electronic components in the furnace, this invention is characterized in which; a pressure reducing chamber capable of reducing a pressure of the atmospheric gas is provided on a transferring line of the board, and gas involved in a heated and melted soldering part on the board is removed in the pressure reducing chamber.

It is preferable that the pressure reducing chamber is arranged within a heating chamber where the heated atmospheric gas circulates.

It is preferable that the heating chamber has a heater and a blowing means, and the atmospheric gas heated by the heater circulates within the chamber through the blowing means driven by a motor arranged outside the heating chamber.

And, it is preferable that the pressure reducing chamber has a heater and a blowing means, and the atmospheric gas heated by the heater circulates within the chamber through the blowing means driven by a motor arranged outside the heating chamber.

Or, it is preferable that the pressure reducing chamber has a heated gas injecting means for blowing out the heated atmospheric gas to the board and a gas guiding duct for connecting a discharging port of the blowing means with the heated gas injecting means.

It is preferable that the motor for driving the blowing means in the heating chamber and the motor for driving the blowing means in the pressure reducing chamber are arranged oppositely at the upper surface and the lower surface of the heating chamber.

As described above, it is preferable that there are provided board transferring conveyors arranged from an inlet side of the furnace up to a position just before the pressure reducing chamber, board transferring conveyors arranged in the pressure reducing chamber and board transferring conveyors arranged from a position just after the pressure reducing chamber up to an outlet of the furnace.

Or, it is preferable that there are provided at board transferring conveyors arranged from an inlet side of the furnace up to a position just before the pressure reducing chamber, a transfer means for transferring the board on the board transferring conveyors into the pressure reducing chamber, board transferring conveyors arranged from a position just after the pressure reducing chamber up to an outlet of the furnace, and a transfer means for transferring the board within the pressure reducing chamber to the board transferring conveyors.

Further, this invention is characterized that a reflow soldering method for soldering electronic components mounted on the board by circulating heated atmospheric gas within a furnace while transferring the board with the electronic components in the furnace, in which; a pressure reducing chamber capable of reducing a pressure of the atmospheric gas is provided on the transferring line of the board, and gas involved in a heated and melted soldering part on the board is removed in the pressure reducing chamber.

Under the aforesaid method, it is preferable that the gas removing process is carried out after heating the board by circulating the heated atmospheric gas within the pressure reducing chamber.

In accordance with this invention, since the gas at the soldering part on the board is processed within the pressure reducing chamber, it is possible to reduce poor soldering having the gas left thereat. In addition, due to the facts that the pressure reducing chamber is provided in the heating chamber where the heated atmospheric gas circulates in the chamber, and that the board with the electronic components is loaded into the pressure reducing chamber while being heated at the heating chamber, the board can be loaded into the pressure reducing chamber without its temperature being decreased.

Further, since the heated atmospheric gas circulated in the heating chamber heats the peripheral walls of the pressure reducing chamber, the atmospheric gas within the pressure reducing chamber is entirely heated through the peripheral walls. Due to this fact, the board processed in the pressure reducing chamber is entirely heated through the peripheral walls. Further, in the case that both a heater and a fan are installed in the pressure reducing chamber to cause the heated atmospheric gas to circulate within the chamber, the soldering part on the board can be positively heated and melted.

DESCRIPTION OF PREFERRED EMBODIMENTS

One embodiment in the present invention is described as the follows (refer to the FIGS. 1 to 7 and 12).

Figure 1:
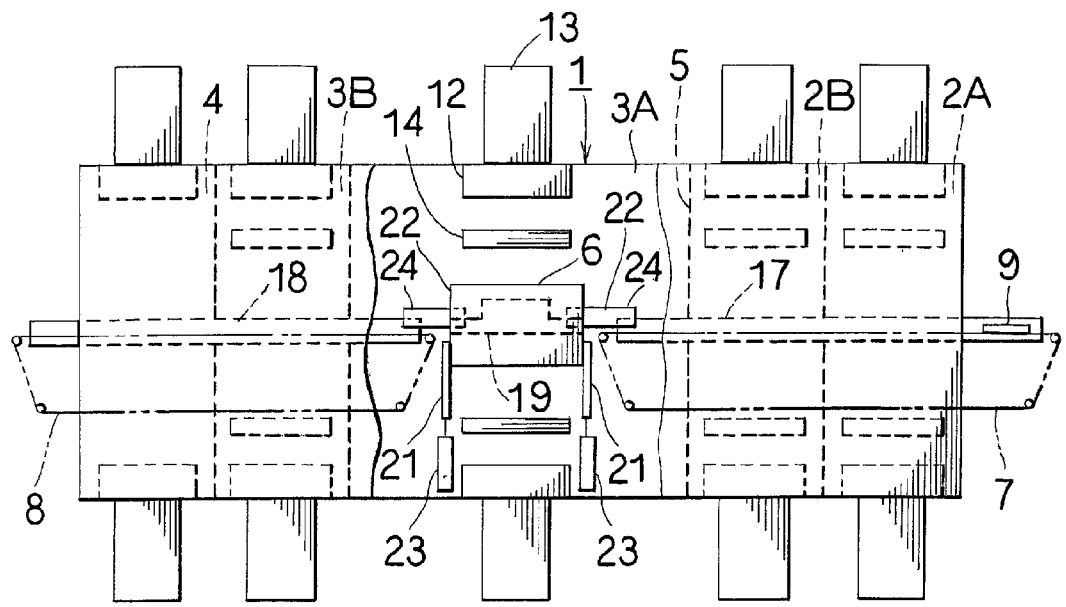
FIG. 1 is a partial ware lined front view showing the shutter opened state of the reflow soldering apparatus in one the embodiment of this invention.
Figure 2:
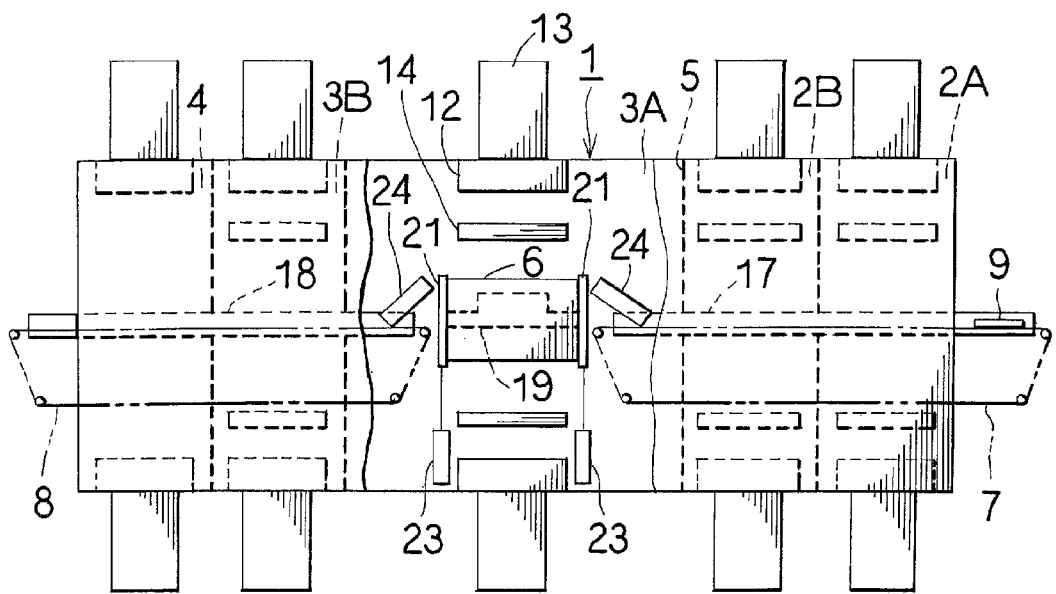
FIG. 2 is a partial ware lined front view showing the shutter closed state of the reflow soldering apparatus in one embodiment of this invention.

As shown in FIGS. 1 and 2, the reflow soldering apparatus has two preheating chamber 2A and 2B, two reflow chambers 3A and 3B, and one cooling chamber 4 within the furnace 1 in sequence along the transferring line. Reference numeral 5 denotes partition walls for parting each of the chambers. Within the furnace 1 is supplied inert gas for preventing oxidization of the solder as atmospheric gas, nitrogen gas in this embodiment.

At the first reflow chamber 3A where the pressure reducing chamber 6 is present. The board transferring conveyors 7 is arranged at the forward side of the pressure reducing chamber 6 and the board transferring conveyors 8 is arranged at the rearward side of the pressure reducing chamber 6 within the furnace 1. The printed circuit board 9 with the electronic components, has a paste-like cream solder pasted at a soldering part on the board, and the printed circuit board 9 is transferred within the preheating chambers 2A and 2B by the board transferring conveyors 7, thereafter the printed circuit board 9 is transferred from the board transferring conveyors 7 into the pressure reducing chamber 6 within the reflow chamber 3A by the first transfer means 25 (refer to FIG. 7) to be described later. Then the printed circuit board 9 is transferred and mounted from the pressure reducing chamber 6 to the board transferring conveyors 8 by a second transfer means 28 (refer to FIG. 7) described later and further transferred within the reflow chamber 3B and the cooling chamber 4.

At the preheating chambers 2A, 2B and the reflow chambers 3A, 3B, reference numeral 12 denotes fans for use in circulating atmospheric gas heated by heaters 14, reference numeral 13 denotes motors for driving the fans 12, and reference numeral 14 denotes heaters.

At the preheating chambers 2A, 2B and the reflow chamber 3B where the pressure reducing chamber 6 is not present, the atmospheric gas heated by the heaters 14 is blown out of the fans 12 and circulates within the chambers, are blown out from plural injection ports of a heated gas injection device not illustrated against the printed circuit board 9 with the electronic components, and the printed circuit board 9 is heated up to a predetermined temperature. It is preferable that each of the chambers is provided with a gas guiding device in such a way that the atmospheric gas blown out of the fans 12 circulates well within the preheating chambers 2A, 2B and the reflow chamber 3B, respectively. The printed circuit board 9 is heated up to a predetermined temperature within the preheating chambers 2A, 2B and the soldering part on the board is heated and melted within the reflow chamber 3B.

At the reflow chamber 3A where the pressure reducing chamber 6 is present, the atmospheric gas heated by the heater 14 is blown out of the fan 12 and circulates within the chamber and the soldering part on the printed circuit board 9 is heated and melted. Further, it is preferable in such a way that the gas guiding device is provided that the atmospheric gas blown out of the fan 12 may circulate well within the reflow chamber 3A.

A heater (not shown in FIGS.) is already buried at the wall part in the pressure reducing chamber 6. The peripheral walls of the pressure reducing chamber 6 is formed by aluminum material. The peripheral walls of the pressure reducing chamber 6 is heated by the heated atmospheric gas circulated within the reflow chamber 3A and the heater is buried at the wall part in the pressure reducing chamber 6, the atmospheric gas within the pressure reducing chamber 6 is entirely heated through the peripheral wall. Due to this heating, the printed circuit board 9 processed within the pressure reducing chamber 6 is heated entirely and uniformly by the heated atmospheric gas within the pressure reducing chamber 6.

The pressure reducing chamber 6 is constituted in such a way that its pressure is reduced to such a degree as one in which the value is reduced by a vacuum pump 31 (refer to FIG. 12) to down to a predetermined reduced atmospheric gas where gas at the soldering part are removed. That is, the vacuum pump 31 is connected to the pressure reducing chamber 6, and an opening/closing valve 33 for carrying out an opening or closing of the line is provided at a connecting line 32 connected between the pressure reducing chamber 6 and the vacuum pump 31. In addition, a nitrogen gas feeding source 34 is connected to the pressure reducing chamber 6, and a releasing valve 36 is provided at a connecting line 35 connected between the pressure reducing chamber 6 and the nitrogen gas feeding source 34.

Accordingly, the gas involved in the melted soldering part on the printed circuit board 9 with the electronic components is removed within the pressure reducing chamber 6 under the predetermined pressure reduced atmosphere.

At the cooling chamber 5, the atmospheric gas acting as the cool gas is blown out of a fan 12 and circulates within the chamber so as to cool the soldering part on the printed circuit board 9 on the board transferring conveyors 8.

The board transferring conveyors 7 arranged within the furnace 1 in a horizontal attitude ranging from the inlet side of the furnace 1 up to a position just before the pressure reducing chamber 6 are constituted by chain-conveyors and a left board transferring conveyor 7 and a right board transferring conveyor 7 in pairs. The printed circuit board 9 with the electronic components is supported by the left right board transferring conveyor 7 and the right board transferring conveyor 7 at the inlet side of the furnace 1, the printed circuit board 9 is moved by the board transferring conveyors 7 within the furnace 1 and transferred to a position just before the pressure reducing chamber 6.

Figure 4:
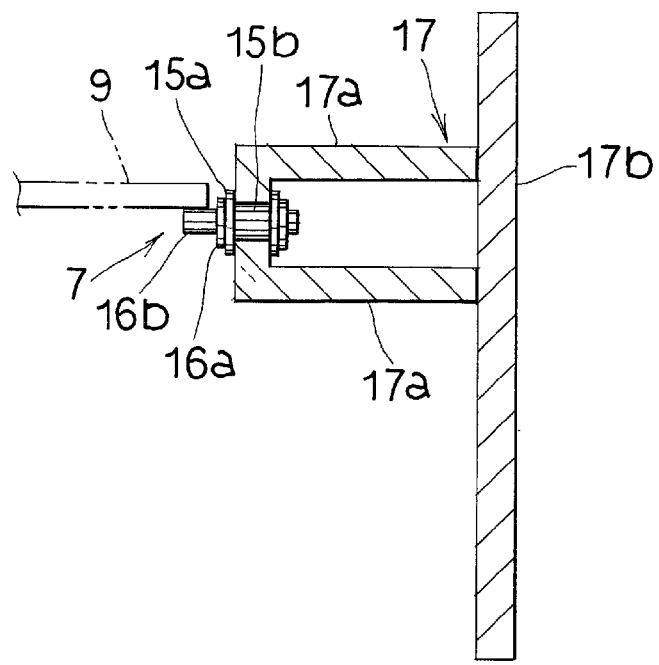
FIG. 4 is a longitudinal cross sectional view showing a board transferring conveyor and a guide rail.

The board transferring conveyors 7 is constituted by connecting roller link and pin link alternately. As shown in FIG. 4, the roller link is constituted by a roller link plate 15*a* and a roller 15*b*, the pin link is constituted by a pin link plate 16*a* and a connector pin 16*b*, and the connector pin 16*b* protrudes inwardly from the side surface of the pin link plate 16*a*. Accordingly, the left and the right board transferring conveyors 7 transfer the printed circuit board 9 with the electronic components while the left and right ends at the lower surface of the printed circuit board 9 are being supported with the connector pin 16*b* protrudes inwardly from the side surface of the pin link plate 16*a*.

The board transferring conveyors 7 has guiding rails 17. The guiding rails 17 are arranged along the board transferring conveyors 7, so as to guide the board transferring conveyors 7 to move in a horizontal direction. As shown in FIG. 4, the guiding rail 17 is constituted by a pair of an upper horizontal rail 17*a* and a lower horizontal rail 17*a* and a vertical plate member 17*b*. The vertical plate member 17*b* fixing the outer surface of upper/lower horizontal rails 17*a* are extending upwardly from the horizontal rails 17*a*. The board transferring conveyor 7 is operated such that the roller 15*b* of the roller link 15 is held and guided by the upper/lower horizontal rails 17*a* of the guiding rails 17 and is moved horizontally from the inlet side of the furnace 1 up to the position just before the pressure reducing chamber 6.

One of the left or the right board transferring conveyor 7 and the guiding rail 17 in pairs are constituted that they can be move together in a width direction, and the other board transferring conveyor 7 and the guide rail 17 in pairs are fixed and cannot move. That is, one the board transferring conveyor 7 and the guiding rail 17 in pairs can move together horizontally in a width direction and they are constituted in such a way that a width size between the left board transferring conveyor 7 and the right board transferring conveyor 7 can be modified in response to the width size of the printed circuit board 9 with the electronic components.

The board transferring conveyors 8 and guiding rails 18 at the outlet side of the furnace 1 are also constituted in the same manner as that of the board transferring conveyors 7 and the guiding rails 17. That is, board transferring conveyors 8 is constituted by chain conveyors and a left board transferring conveyor 8 and a right board transferring conveyor 8 in parts. The printed circuit board 9 with the electronic components is supported by the left board transferring conveyor 8 and the right board transferring conveyor 8 and moved in the furnace 1 and transferred to the outlet. The guiding rail 18 to guide the board transferring conveyor 8 to move in a horizontal direction, is constituted by a pair of upper and lower horizontal rails and a vertical plate member 18*b* having the horizontal rails fixed thereto. Then, one of the left or the right board transferring conveyor 8 and the guiding rail 18 in pairs are constituted that they can be move together horizontally in a width direction, and a width size between the left board transferring conveyor 8 and the right board transferring conveyor 8 can be modified in response to the width size of the printed circuit board 9 with the electronic components.

In the cases of the conventional reflow soldering apparatus, one of the left or the right board transferring conveyor and the guiding rail in pairs are constituted that they can be moved together in a width direction, for transfer various width sizes of the printed circuit boards.

As the moving mechanism of the board transferring conveyors and the guiding rails, a feeding screw mechanism in general has been employed. Although not illustrated, the board transferring conveyors 7, 8 and the guiding rails 17, 18 in the this embodiment and the moving mechanism for in the width direction are also constituted by the feeding screw mechanism similar to that of the prior art.

Figure 3:
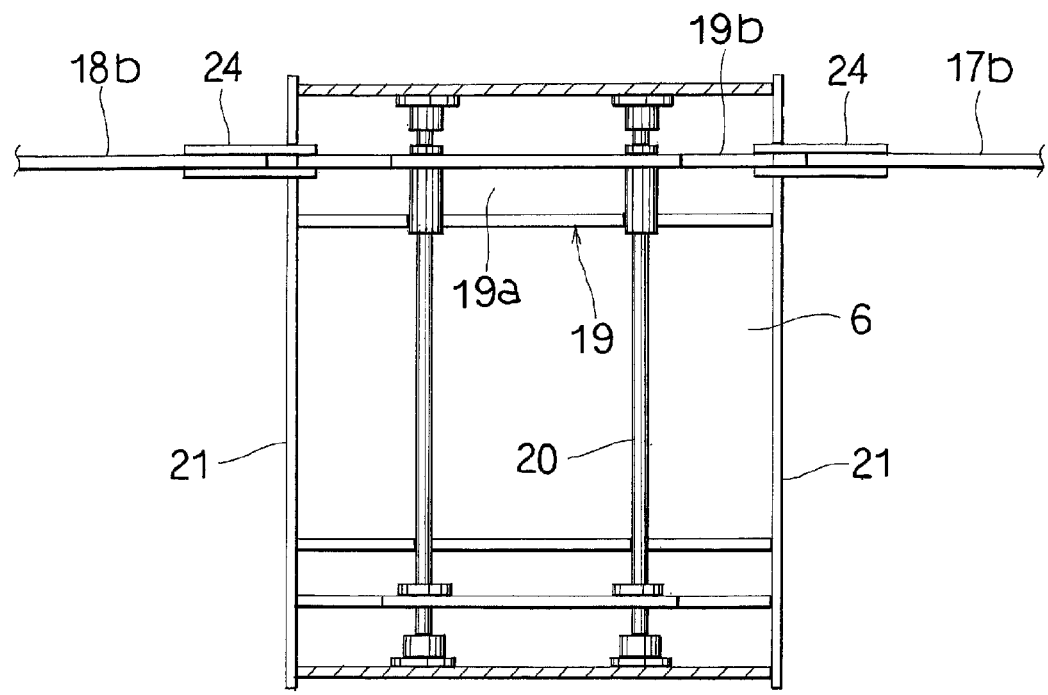
FIG. 3 is a flat cross sectional view showing the pressure reducing chamber.
Figure 5:
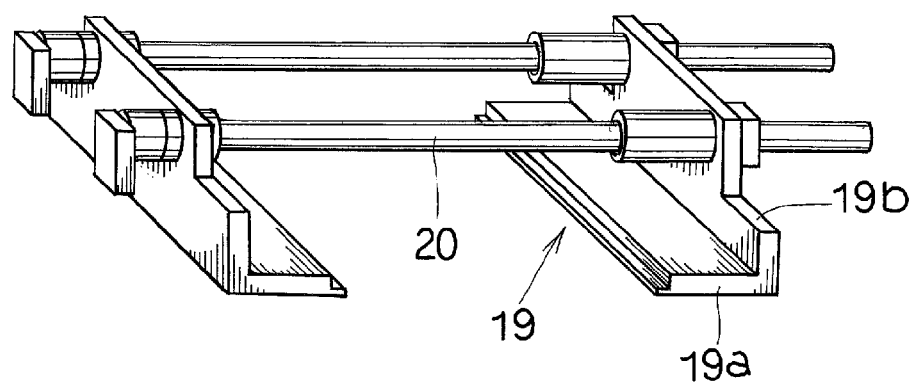
FIG. 5 is a perspective view showing a part of board supporting rails in the pressure reducing chamber.
Figure 6:
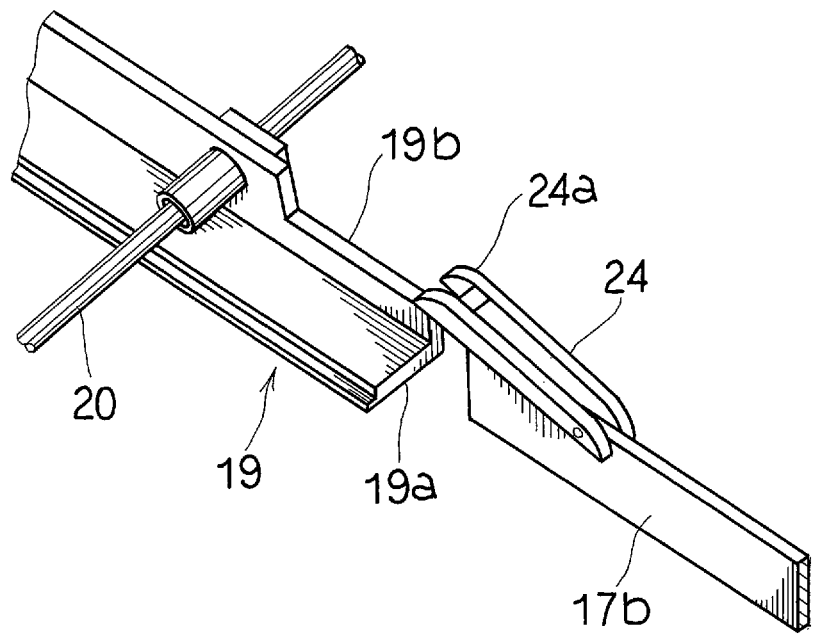
FIG. 6 is a perspective view showing connecting system of the rail connector member.

As shown in FIGS. 3 and 5, the pressure reducing chamber 6 has a pair of left and right board supporting rails 19 therein. The board supporting rail 19 is the rail member having an L-shaped section extending horizontally along transferring line of the board and this is constituted by horizontal rail 19*a* and vertical plate 19*b* extending vertically from the outer end of the horizontal rail 19*a*. The horizontal rail 19*a* have its inner end formed like a step shape lower by one step from its upper surface, and the left and right ends at the lower surface of the printed circuit board 9 is supported on inner end surface of horizontal rail 19*a* of the left and the right board supporting rails 19.

The left and right board supporting rails 19 are supported at a pair of the front and the rear supporting rods 20 fixed in a horizontal orientation within the pressure reducing chamber 6. The supporting rods 20 extend horizontally in a direction crossing at a right angle with transferring line of the board, pass through the board supporting rails 19 and support the board supporting rails 19. One board supporting rail 19 is movably supported at the supporting rods 20 and the other board supporting rail 19 is fixed to the supporting rods 20. That is, one board supporting rail 19 is constituted that can move horizontally in a width direction along the supporting rods 20 and a width size between the left board supporting rail 19 and the right board supporting rail 19 can be modified.

Shutters 21 for opening or closing operation through its moving-up or moving-down operation are provided with a forward surface and a rearward surface of the pressure reducing chamber 6, and to open or close the opening parts 22 at the forward surface and rearward surface of the pressure reducing chamber 6. The shutters 21 move up or down by a cylinder device 23, and the opening parts 22 of the pressure reducing chamber 6 are opened at its lower position and the opening parts 22 of the pressure reducing chamber 6 are closed at its upper position. The pressure reducing chamber 6 is constituted that the opening/closing valve 33 is opened when the shutters 21 are closed to keep its sealingly closed state and its pressure is reduced down to a predetermined reduced pressure atmospheric state by the vacuum pump 31.

As shown in FIGS. 1, 2, 3 and 6, a rail connector member 24 is fitted at the guiding rail 17 of the board transferring conveyor 7 that can be moved in the width direction of the left or the right the board transferring conveyor 7 at the inlet side of the furnace 1 in such a way that the base end of rail connector member 24 is fitted at the upper end of the pressure reducing chamber 6 side of the vertical plate member 17*b* can be turned in an upward or downward direction. The rail connector member 24 has a connector piece 24*a* at its extremity end for use in holding from both right and left sides of the vertical plate 19*b* of the board supporting rail 19 that can move in the width direction. Also to the rail connector member 24 is fitted at the guiding rail 18 of the board transferring conveyor 8 that can move in the width direction of the left or the right board transferring conveyors 8 at the outlet side of the surface 1 in the same manner as that described above.

The rail connector members 24 acts described as follows. That is, in the case that the shutters 21 moves downward and the shutter 21 is opened and the pressure reducing chamber 6 is kept open, the connector pieces 24*a* at the extremity end of the rail connector members 24 are supported on the upper surface of the horizontal rails 19*a* of the board supporting rails 19 while holding from both left and right sides of the vertical plate 19*b* of the board supporting rail 19. Under this state, since the guiding rails 17 of the board transferring conveyors 7 arranged at the forward positions of the pressure reducing chamber 6, the guiding rails 18 of the board transferring conveyors 8 arranged at the rearward positions of the pressure reducing chamber 6 and the board supporting rails 19 within the pressure reducing chamber 6 are connected by the rail connector members 24 and assembled into an integral unit, so that, they can be moved together. Accordingly, if the width sizes of the pairs of board transferring conveyors 7, 8 supporting the left and right ends of the printed circuit board 9 are modified in response to the width size of the printed circuit board 9 with the electronic components, it is possible to modify the width size of the board supporting rails 19 within the pressure reducing chamber 6 together.

Then, in the case that the shutters 21 is moved upwardly and the shutters 21 is closed and the pressure reducing chamber 6 is closed, the rail connector members 24 is turned upwardly by the upper surface of the shutters 21 along with the upward motion of the shutters 21 and the connector pieces 24a at the extremity end of the rail connector members 24 is disengaged from the vertical plates 19b of the board supporting rails 19.

As described above, the board supporting rails 19 within the pressure reducing chamber 6 to connect or to take off the guiding rails 17, 18 of the board transferring conveyors 7, 8 by the rail connector members 24 under an opening or closing operation of the shutters 21 of the pressure reducing chamber 6. Then, the rail connector members 24 connects the guiding rails 17, 18 and the board supporting rails 19 when the shutters 21 is opened (the pressure reducing chamber 6 is being kept open) and disconnects the guiding rails 17, 18 and the board supporting rails 19 when the shutters 21 is closed (the pressure reducing chamber 6 is kept closed).

Figure 7:
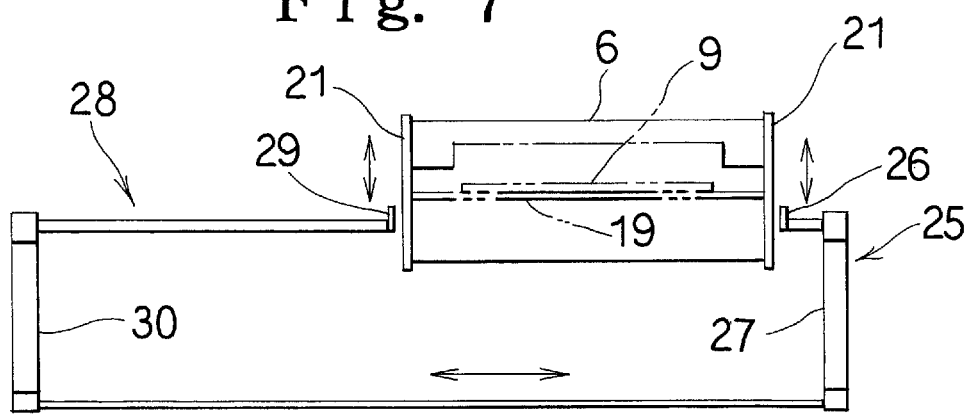
FIG. 7 is a front view showing transfer means.

Then, there will be described the first transfer means 25 for use in transferring the printed circuit board 9 with the electronic components from the board transferring conveyors 7 to the pressure reducing chamber 6. Although the first transfer means 25 is not illustrated in FIGS. 1 and 2, it is provided within the furnace 1, it has a pushing part 26 for use in pushing the rear surface of the printed circuit board 9 as shown in FIG. 7, wherein the pushing part 26 is constituted that it can be moved up and down by a cylinder device 27 and further a cylinder device 27 can be moved horizontally in a forward or rearward direction.

Accordingly, in the case that the printed circuit board 9 on the board transferring conveyors 7 is moved to and mounted in the pressure reducing chamber 6, it is moved horizontally forward by a predetermined distance toward the pressure reducing chamber 6 after the pushing part 26 moves to the rear surface of the printed circuit board 9, thereby the pushing part 26 pushes the rear surface of the printed circuit board 9 and cause the printed circuit board 9 to be moved from the board transferring conveyors 7 and mounted in the pressure reducing chamber 6.

A second transfer means 28 for use in moving the printed circuit board 9 with the electronic components from the pressure reducing chamber 6 to the board transferring conveyors 8 is also constituted in the same manner as that of the first transfer means 27. That is, the second transfer means 28 is also arranged within the furnace 1 (not illustrated in FIGS. 1 and 2), has a pushing part 29 for use in pushing against the rear surface of the printed circuit board 9, the pushing part 29 can be moved up and down by a cylinder device 30, and further, the cylinder device 30 can be moved horizontally in a forward or rearward direction along transferring line of the board.

Accordingly, in the case that the printed circuit board 9 within the pressure reducing chamber 6 is moved to and mounted at the board transferring conveyors 8, the pushing part 29 moves horizontally only by a predetermined distance toward outside the pressure reducing chamber 6 after the pushing part 29 moves to the rear surface of the printed circuit board 9, thereby the pushing part 29 pushes against the rear surface of the printed circuit board 9 and cause the printed circuit board 9 to be moved from the pressure reducing chamber 6 and mounted on the board transferring conveyors 8.

In the preferred embodiment of this invention, the cylinder device 27 of the first transfer means 25 and the cylinder device 30 of the second transfer means 28 are constituted in such a way that they are moved together forward and rearward.

There will be described an operation of the reflow soldering apparatus as follows.

The opening/closing valve 33 on the connecting line 32 of the vacuum pump 31 is closed, the releasing valve 36 is kept open and nitrogen gas is supplied within the pressure reducing chamber 6 from the nitrogen gas feeding source 34.

The printed circuit board 9 with the electronic components on the board transferring conveyors 7 at the inlet side of the furnace 1, transferred by the board transferring conveyors 7 to the position just before the pressure reducing chamber 6 and is moved by the first transfer means 25 from the board transferring conveyors 7 into the pressure reducing chamber 6 of the reflow chamber 3A and mounted there. At this time, the shutters 21 are moved downward and the shutters 21 are kept open.

With the foregoing, the fans 12 within each of the preheating chambers 2A, 2B, the reflow chambers 3A, 3B and the cooling chamber 4 are rotationally driven by the motors 13.

At the preheating chamber 2A and 2B, the atmospheric gas heated by the heaters 14 is sucked into the fans 12, blown out of it and circulated within the chambers. Accordingly, the printed circuit board 9 with the electronic components is heated within the preheating chambers 2A, 2B to a predetermined temperature by the heated atmospheric gas circulated within each of the chambers.

At the reflow chamber 3A where the pressure reducing chamber 6 is present, the atmospheric gas heated by the heater 14 is sucked into the fan 12 and the atmospheric gas is blown out and circulates in the chamber. Accordingly, the printed circuit board 9 with the electronic components is mounted into the pressure reducing chamber 6 while being heated by the heated atmospheric gas. As a result, the printed circuit board 9 is loaded into the pressure reducing chamber 6 without its temperature being decreased.

The peripheral walls of the pressure reducing chamber 6 is heated with the heated atmospheric gas circulated in the reflow chamber 3A and the heater buried in the wall of the pressure reducing chamber 6 so as the atmospheric gas within the pressure reducing chamber 6 is entirely heated. Due to this fact, the printed circuit board 9 is heated entirely and uniformly by the heated atmospheric gas within the pressure reducing chamber 6.

Accordingly, the soldering part on the printed circuit board 9 with the electronic components is heated and melted at the reflow chamber 3A and further it is heated for a predetermined hour within the pressure reducing chamber 6 and its soldering part is more melted.

After this operation, the shutters 21 are moved upwardly and the shutters 21 are closed, the pressure reducing chamber 6 is sealingly closed and the releasing valve 36 is closed, and at the same time the opening/closing valve 33 on the connecting line 32 of the vacuum pump 31 is released and the vacuum pump 31 is operated. With this arrangement, the nitrogen gas within the pressure reducing chamber 6 is discharged by the vacuum pump 31 up to such a degree as one in which it becomes a predetermined atmospheric gas.

The pressure reducing chamber 6 is held for a predetermined time with the predetermined pressure reduced atmospheric gas capable of the gas involved in a heated and melted soldering part on the board is removed and a gas removing processing for the printed circuit board 9 is carried out within the pressure reducing chamber 6 for the predetermined time.

After this operation, the opening/closing valve 33 is closed, the releasing valve 36 is released and the nitrogen gas is supplied from the nitrogen gas feeding source 34 into the pressure reducing chamber 6. Then, after the shutters 21 are moved downward and the shutters 21 are opened, the printed circuit board 9 is moved by second transfer means 28 and mounted from the pressure reducing chamber 6 of the reflow chamber 3A to the board transferring conveyors 8 and then it is transferred to the outlet.

At the reflow chamber 3B where the pressure reducing chamber 6 is not present, the atmospheric gas heated by the heater 14 is sucked into the fan 12, blown out there and then circulated within the chamber. Accordingly, the printed circuit board 9 is heated with the heated atmospheric gas circulated within the chamber up to a predetermined high temperature and the soldering part is heated and melted.

As described above, the cream-like soldering on the soldering part on the printed circuit board 9 with the electronic components is heated up to a predetermined temperature at the preheating chambers 2A, 2B while the printed circuit board 9 is being transferred within the furnace 1. The soldering part on the printed circuit board 9 is further heated and melted within the reflow chamber 3A and the pressure reducing chamber 6 and at the same time the gas at the soldering part is removed at the pressure reducing chamber 6. The soldering part on the printed circuit board 9 is further heated and melted at the reflow chamber 3B, and subsequently the melted soldering is cooled and solidified at the cooling chamber 4 and the electronic components are soldered onto the board.

At the above reflow soldering apparatus, the width sizes of the guiding rails 17 of the board transferring conveyors 7 and the guiding rails 18 of the board transferring conveyors 8 and the board supporting rails 19 within the pressure reducing chamber 6 are modified in response to the width size of the printed circuit board 9 with the electronic components. That modification is carried out as follows.

The shutters 21 of the pressure reducing chamber 6 is moved downward and the shutters 21 is opened. At this time, the connector pieces 24a at the extremity end of the rail connector member 24 is supported on the upper surface of the horizontal rails 19a of the board supporting rails 19 while holding from both left and right sides of the vertical plates 19b of the board supporting rails 19. Under this state, the guiding rails 17 of the board transferring conveyors 7 arranged at the front side of the pressure reducing chamber 6, the guiding rails 18 of the board transferring conveyors 8 arranged at the rear side of the pressure reducing chamber 6 and the board supporting rails 19 within the pressure reducing chamber 6 are connected by the rail connector member 24 and assembled into an integral unit, so that, they can be moved together. Accordingly, if the width sizes of the pairs of board transferring conveyors 7, 8 supporting the left and right ends of the printed circuit board 9 are modified in response to the width size of the printed circuit board 9 with the electronic components, it is possible to modify the width size of the board supporting rails 19 within the pressure reducing chamber 6 together.

When the shutters 21 is moved upwardly and the shutters 21 is closed and the pressure reducing chamber 6 is closed, the rail connector member 24 is turned upwardly by the upper surface of the shutters 21 along with the upward motion of the shutters 21, and the connector pieces 24a at the extremity end of the rail connector member 24 is released from the vertical plates 19b of the board supporting rails 19.

As described above, the rail connector members 24 causes the guiding rails 17, 18 of the board transferring conveyors 7, 8 to contact or to take off the board supporting rails 19 within the pressure reducing chamber 6 in cooperation with the opening or closing operation of the shutters 21 of the pressure reducing chamber 6, and the rail connector members 24 connects the guiding rails 17, 18 and the board supporting rails 19 when the shutters 21 is opened (the pressure reducing chamber 6 is being kept open) and disconnects the guiding rails 17, 18 and the board supporting rails 19 when the shutters 21 is closed (the pressure reducing chamber 6 is kept closed).

Then, referring to FIGS. 8 to 12, another preferred embodiment of this invention will be described as follows.

Figure 8:
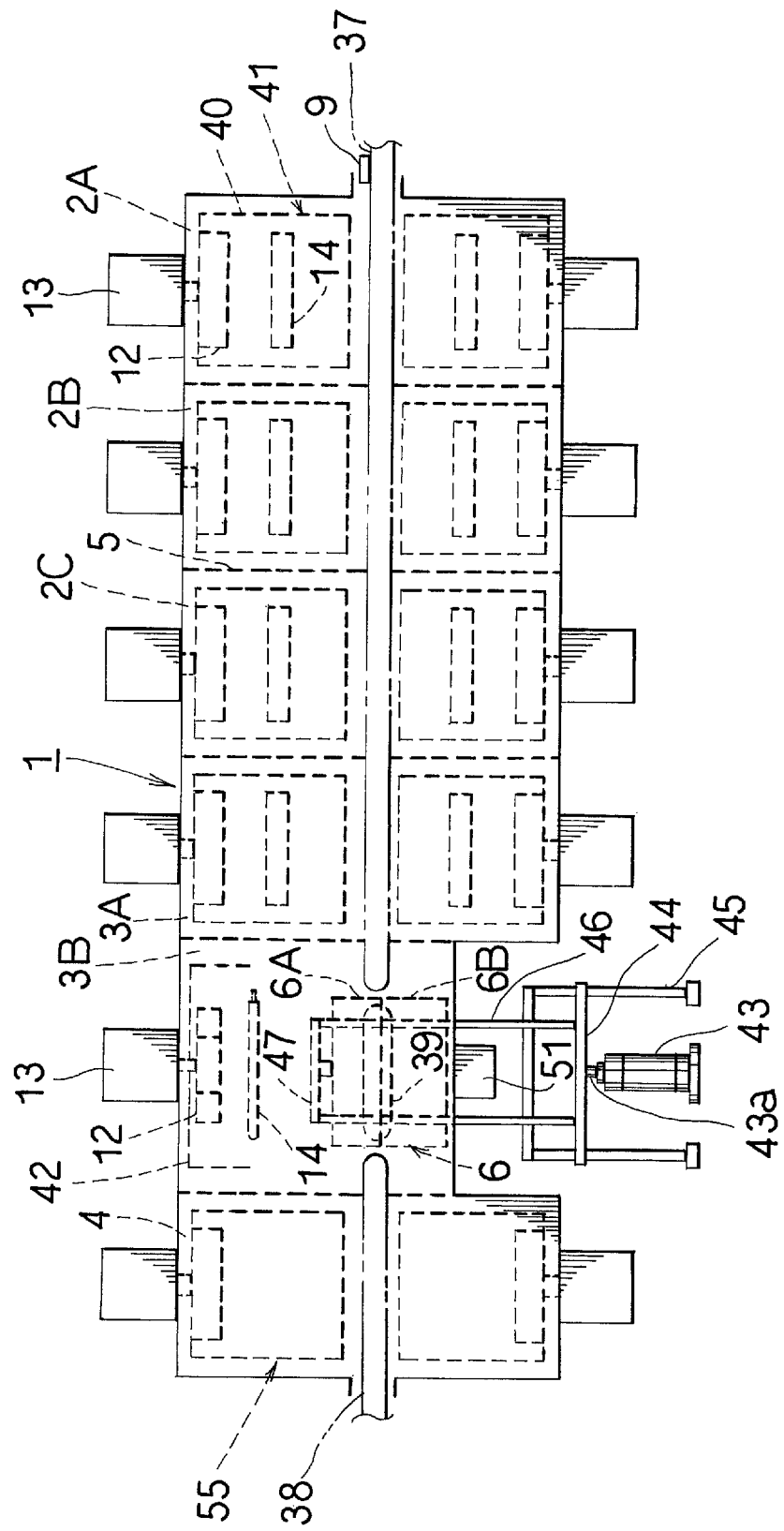
FIG. 8 is a front view showing the reflow soldering apparatus in the other embodiment of this invention.
Figure 9:
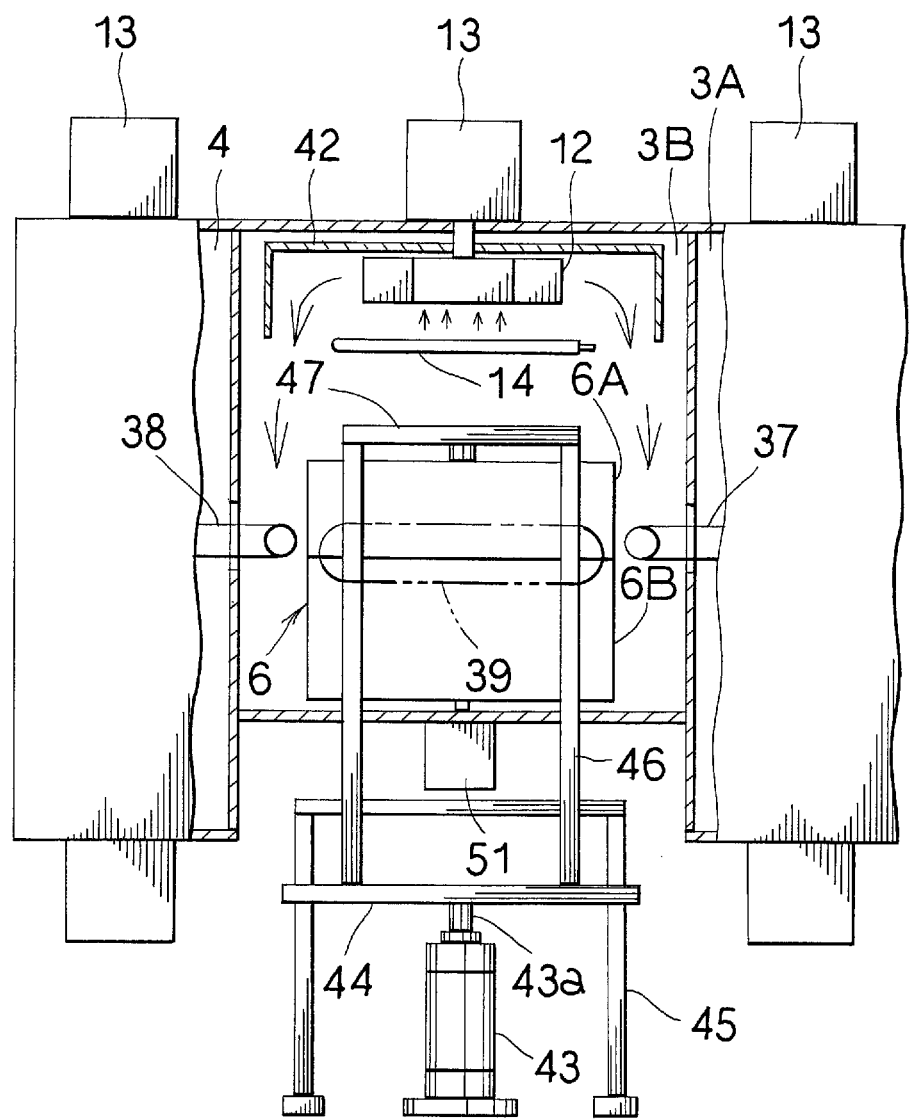
FIG. 9 is a partial cross sectional front view showing a part near the pressure reducing chamber.

As shown in FIG. 8, the reflow soldering apparatus has three preheating chambers 2A, 2B, 2C, two reflow chambers 3A, 3B and one cooling chamber 4 within the furnace 1 in sequence along the transferring line of the board. Reference numeral 5 denotes partition walls for parting each of the chambers. Within a furnace 1 is supplied inert gas for preventing oxidization of the solder as atmospheric gas, nitrogen gas in this preferred embodiment.

A pressure reducing chamber 6 is provided within the last reflow chamber 3B. Within the furnace 1 at the front side and the rear side of the pressure reducing chamber 6 is arranged each of board transferring conveyors 37, 38 and also board transferring conveyors 39 is arranged within the pressure reducing chamber 6.

A pair of the left and the right board transferring conveyors 37 is arranged horizontally from the inlet side of the furnace 1 up to a position just before the pressure reducing chamber 6 are constituted by chain conveyors having the same constitution as that of the board transferring conveyors 7 described in the aforesaid preferred embodiment. A printed circuit board 9 with the electronic components is supported by the left board transferring conveyor 37 and the right board transferring conveyor 37 at the inlet side of the furnace 1, the printed circuit board 9 is moved within the furnace 1 by the board transferring conveyors 37 and transferred up to a position just before the pressure reducing chamber 6.

A pair of the left and the right board transferring conveyors 38 is arranged horizontally within the furnace 1 from a position just after the pressure reducing chamber 6 up to the outlet of the furnace 1 is also constituted by a chain conveyor. The printed circuit board 9 with the electronic components is supported by the left board transferring conveyor 38 and the right board transferring conveyor 38 moved within the furnace 1 from a position just after the pressure reducing chamber 6 and transferred up to the outlet.

A pair of the left and the right board transferring conveyors 39 is arranged horizontally within the pressure reducing chamber 6 is also constituted by a chain conveyor in the same manner as those of the board transferring conveyors 37 and the board transferring conveyors 38.

The printed circuit board 9 with the electronic components has a paste-like creamy soldering material pasted at the soldering part, the printed circuit board 9 is transferred within the preheating chambers 2A, 2B, 2C and the first reflow chamber 3A by the board transferring conveyors 37 and loaded into the last reflow chamber 3B, thereafter the printed circuit board 9 is moved to and mounted to the board transferring conveyors 39 within the pressure reducing chamber 6, and the printed circuit board 9 is set at the predetermined position within the pressure reducing chamber 6 by the board transferring conveyors 39. The printed circuit board 9 is heated within the pressure reducing chamber 6 and the bubbles are removed, thereafter the printed circuit board 9 is moved by the board transferring conveyors 39 from the pressure reducing chamber 6 to the board transferring conveyors 38 and mounted on there, the printed circuit board 9 is transferred by the board transferring conveyors 38 from the last reflow chamber 3B and within the cooling chamber 4.

At the preheating chambers 2A, 2B, 2C and the first reflow chamber 3A, reference numeral 12 denotes fans for use in circulating the atmospheric gas heated by the heaters 14, reference numeral 13 denotes motors for use in driving the fans 12, reference numeral 14 denotes heaters, and reference numeral 40 denotes gas guiding devices. Heated gas circulation devices 41 constituted by these components, in which the heated gas circulation devices 41 are arranged at the upper part and the lower part to hold the board transferring conveyors 37 therebetween.

Accordingly, at the preheating chambers 2A, 2B, 2C and the first reflow chamber 3A where the pressure reducing chamber 6 is not present, the atmospheric gas heated by the heaters 14, is sucked into suction ports of the fans 12, discharged from radial discharging ports of the fans 12 into the gas guiding devices 40, guided by the gas guiding devices 40 and blown to the printed circuit board 9 on the board transferring conveyors 37 from plural gas discharging ports arranged facing to the board transferring conveyors 37. After this operation, the heated atmospheric gas is sucked from the suction ports of the fans 12 and discharged from the discharging ports into the gas guiding devices 40 as described above. In this way, the heated atmospheric gas is circulated by the heated gas circulation devices 41 within each of the preheating chambers 2A, 2B, 2C and the reflow chamber 3A and then the printed circuit board 9 with the electronic components is heated.

The printed circuit board 9 with the electronic components is heated up to a predetermined temperature at the preheating chambers 2A, 2B, 2C while being transferred within the furnace 1 by the board transferring conveyors 37 and then the soldering part is heated and melted at the first reflow chamber 3A.

At the reflow chamber 3B where the pressure reducing chamber 6 is present, reference numeral 12 denotes a fan for use in circulating the atmospheric gas heated by a heater 14, reference numeral 13 denotes a motor for use in driving the fan 12, reference numeral 14 denotes the heater and reference numeral 42 denotes a gas guiding cover. The fan 12 has a vertical rotating shaft, the fan 12 is installed at the upper position within the reflow chamber 3B and its rotating shaft is connected to a rotary shaft of the motor 13 is installed at the upper side of the reflow chamber 3B. The fan 12 has a suction port opened to inside the reflow chamber 3B at its lower surface and has discharging ports at its outer periphery. The gas guiding cover 42 covers the upper side and the side of the fan 12 and its lower surface is released to open. The heater 14 is installed at the lower position below the fan 12 within the reflow chamber 3B. The pressure reducing chamber 6 is located below the fan 12 and the heater 14 and is provided at the lower position within the reflow chamber 3B.

Accordingly, the atmospheric gas heated by the heater 14 is sucked into the suction port of the fan 12 under operation of the fan 12, discharged out of the discharging ports, flows downward while being guided by the gas guiding cover 42, after heats the printed circuit board 9 with the electronic components on the board transferring conveyors 37 and the pressure reducing chamber 6, passes through the heater 14 as heated, sucked into the fan 12 and then discharged. In this way, the heated atmospheric gas is circulated within the reflow chamber 3B to heat the printed circuit board 9 with the electronic components on the board transferring conveyors 37 and the peripheral walls of the pressure reducing chamber 6.

The printed circuit board 9 with the electronic components is transferred by the board transferring conveyors 37 and loaded into the pressure reducing chamber 6 without decreasing its temperature while the soldering part is heated and melted at the last reflow chamber 3B.

As shown in FIGS. 8 to 11, the pressure reducing chamber 6 is divided into an upper part and a lower part, so the pressure reducing chamber 6 is constituted by an upper housing 6A and a lower housing 6B. The lower housing 6B is fixed within the reflow chamber 3B. To the contrary, the reflow chamber 3A is constituted in such a way that it can be moved up and down by a cylinder device 43.

The supporting plate member 44 is fixed to the upper end of a forwarding/retracting rod 43a of the cylinder device 43 is installed vertically at the lower position of the reflow chamber 3B. A pair of columns 45 spaced apart forward or rearward along a direction of the transferring line of the board are vertically arranged to pass through the supporting plate member 44. Accordingly, the supporting plate member 44 is moved up and down by the cylinder device 43 while being guided by the columns 45. Four columns 46 stand vertically on the upper surface of the supporting plate member 44 and to pass through the lower surface of the reflow chamber 3B in an upward or downward movable manner and arranged around the pressure reducing chamber 6. These columns 46 have upper end portions connected to a connecting plate member 47, and the connecting plate member 47 is connected to the upper surface of the upper housing 6A of the pressure reducing chamber 6.

Accordingly, the forwarding/retracting rod 43a is moved up and down by the cylinder device 43 to cause the upper housing 6A of the pressure reducing chamber 6 to be moved up and down, and there are provided a sealingly closed state (refer to FIG. 10) where the upper housing 6A is closely contacted with the lower housing 6B and a released state (refer to FIG. 11) where the upper housing 6A is arranged to be spaced apart against the lower housing 6B.

The pressure reducing chamber 6 has a heated gas circulation device 48 for use in circulating the heated atmospheric gas. The heated gas circulation device 48 comprises a heater 49 for use in heating the atmospheric gas, a fan 50 for use in circulating the heated atmospheric gas, a motor 51 for use in driving the fan 50, a gas guiding duct 52 connected to the discharging port of the fan 50, a heated gas injection casing member 53, and an gas guiding duct 54 connected to the heated gas injection casing member 53.

The fan 50 has a vertical rotating shaft, it is installed at the bottom part in the lower housing 6B and its rotating shaft is connected to a rotating shaft of the motor 51 is installed at the lower side of the reflow chamber 3B. Accordingly, the motor 13 for use in driving the fan 12 within the reflow chamber 3B and the motor 51 for use in driving the fan 50 within the pressure reducing chamber 6 are positioned against the upper surface and the lower surface of the reflow chamber 3B. The fan 50 has a suction port opened to inside the pressure reducing chamber 6 at is the upper surface and has discharging ports opened to its the outer periphery that is connected to the gas guiding duct 52.

The gas guiding duct 52 extends laterally in a radial direction of the fan 50, extends upwardly and vertically up to the upper end of the lower housing 6B and its extremity end is opened. The heater 49 is positioned at the upper part from the fan 50 within the lower housing 6B.

The heated gas injection casing member 53 is fixed at the upper position within the upper housing 6A, and arranged oppositely facing to the board upper transferring conveyors 39 of the pressure reducing chamber 6, and has plural the heated gas discharging ports for blowing the heated atmospheric gas to the printed circuit board 9 with the electronic components on the board transferring conveyors 39. To the heated gas injection casing member 53 is connected the gas guiding duct 54. The gas guiding duct 54 extends in a lateral direction from the heated gas injection casing member 53, further extends downward and vertically to the lower end of the upper housing 6A, and its extremity end is opened.

In the case that the pressure reducing chamber 6 is sealingly closed, the gas guiding duct 54 within the upper housing 6A is connected to the gas guiding duct 52 within the lower housing 6B. Accordingly, in the case that the pressure reducing chamber 6 is sealingly closed, the atmospheric gas heated by the heater 49 is sucked at the suction port of the fan 50 under an operation of the fan 50, discharged out of the discharging ports, flows in the gas guiding duct 52, the gas guiding duct 54, flows into the heated gas injection casing member 53 and is blown from plural the heat gas discharging ports to the upper surface of the printed circuit board 9 with the electronic components on the board transferring conveyors 39.

The heated gas blown to the upper surface of the printed circuit board 9 with the electronic components heats the printed circuit board 9 with the electronic components, thereafter flows downward at a space within the pressure reducing chamber 6, passes through the heater 49 as heated, sucked into the fan 50 and then discharged. In this way, the heated atmospheric gas circulates within the pressure reducing chamber 6 to heat the printed circuit board 9 with the electronic components. In addition, since the heated atmospheric gas circulated in the reflow chamber 3B heats the peripheral walls of the pressure reducing chamber 6, the atmospheric gas within the pressure reducing chamber 6 is entirely heated through the peripheral walls. Due to this fact, the printed circuit board 9 processed in the pressure reducing chamber 6 is entirely and uniformly heated by the heating atmospheric gas within the pressure reducing chamber 6.

The pressure reducing chamber 6 is constituted in such a way that its pressure is reduced by the vacuum pump 31 (refer to FIG. 12) down to the predetermined pressure reducing atmosphere where the gas at the soldering part is removed. That is, the vacuum pump 31 is connected to the pressure reducing chamber 6 and the connecting line 32 connecting the pressure reducing chamber 6 with the vacuum pump 31 is provided with the opening/closing valve 33 for opening or closing the line. In addition, the nitrogen gas feeding source 34 is connected to the pressure reducing chamber 6 and the connecting line 35 between the pressure reducing chamber 6 and the nitrogen gas feeding source 34 is provided with the releasing valve 36.

Accordingly, the printed circuit board 9 with the electronic components has the melted soldering part of which the gas is removed within the pressure reducing chamber 6 with the predetermined pressure reducing atmosphere.

At the cooling chamber 4, a cool gas circulation devices 55 are arranged at an upper part and a lower part while holding the board transferring conveyors 38 there between. The cool gas circulation devices 55 is different from the heated gas circulation devices 41 only in view of a point where no heater is provided and other configurations are the same to each other. Accordingly, at the cooling chamber 4, the atmospheric gas acting as the cool gas circulates in the cooling chamber 4 to cool the soldering part on the printed circuit board 9 on the board transferring conveyors 38.

An operation of the reflow soldering apparatus will be described as follows.

The opening/closing valve 33 on the connecting line 32 of the vacuum pump 31 is closed, the releasing valve 36 is opened and the nitrogen gas is supplied from the nitrogen gas feeding source 34 into the pressure reducing chamber 6.

The printed circuit board 9 with the electronic components is mounted on the board transferring conveyors 37 at the inlet side of the furnace 1, transferred by the board transferring conveyors 37 to a position just before the pressure reducing chamber 6, moved to and mounted on the board transferring conveyors 39 in the pressure reducing chamber 6 and is set at a predetermined position within the pressure reducing chamber 6 by the board transferring conveyors 39. At this time, the upper housing 6A of the pressure reducing chamber 6 is positioned in spaced-apart above the lower housing 6B by the cylinder device 43 (refer to FIG. 11).

With the foregoing, at the preheating chambers 2A, 2B, 2C, the reflow chambers 3A, 3B and the cooling chamber 4, the fans 12 in each of the chambers is rotationally driven by the motors 13.

At the preheating chambers 2A, 2B, 2C, and the first reflow chamber 3A where the pressure reducing chamber 6 is not present, the atmospheric gas heated by the heaters 14 is sucked into the fans 12 and circulates in each of the chambers. Accordingly, the printed circuit board 9 with the some electronic components is heated by the heated atmospheric gas circulated in each of the chambers to the predetermined temperature at each of the preheating chambers 2A, 2B, 2C and heated up to the predetermined high temperature at the first reflow chamber 3A where the pressure reducing chamber 6 is not present and the soldering part is melted.

At the last reflow chamber 3B where the pressure reducing chamber 6 is present, the atmospheric gas heated by the heater 14 is sucked into the fan 12 and discharged out of it and circulates in the chamber. Accordingly, the printed circuit board 9 with the electronic components is transferred into the pressure reducing chamber 6 while its soldering part is being heated and melted by the heating atmospheric gas circulated in the reflow chamber 3B. As a result, the printed circuit board 9 is transferred into the pressure reducing chamber 6 without decreasing its temperature.

Figure 10:
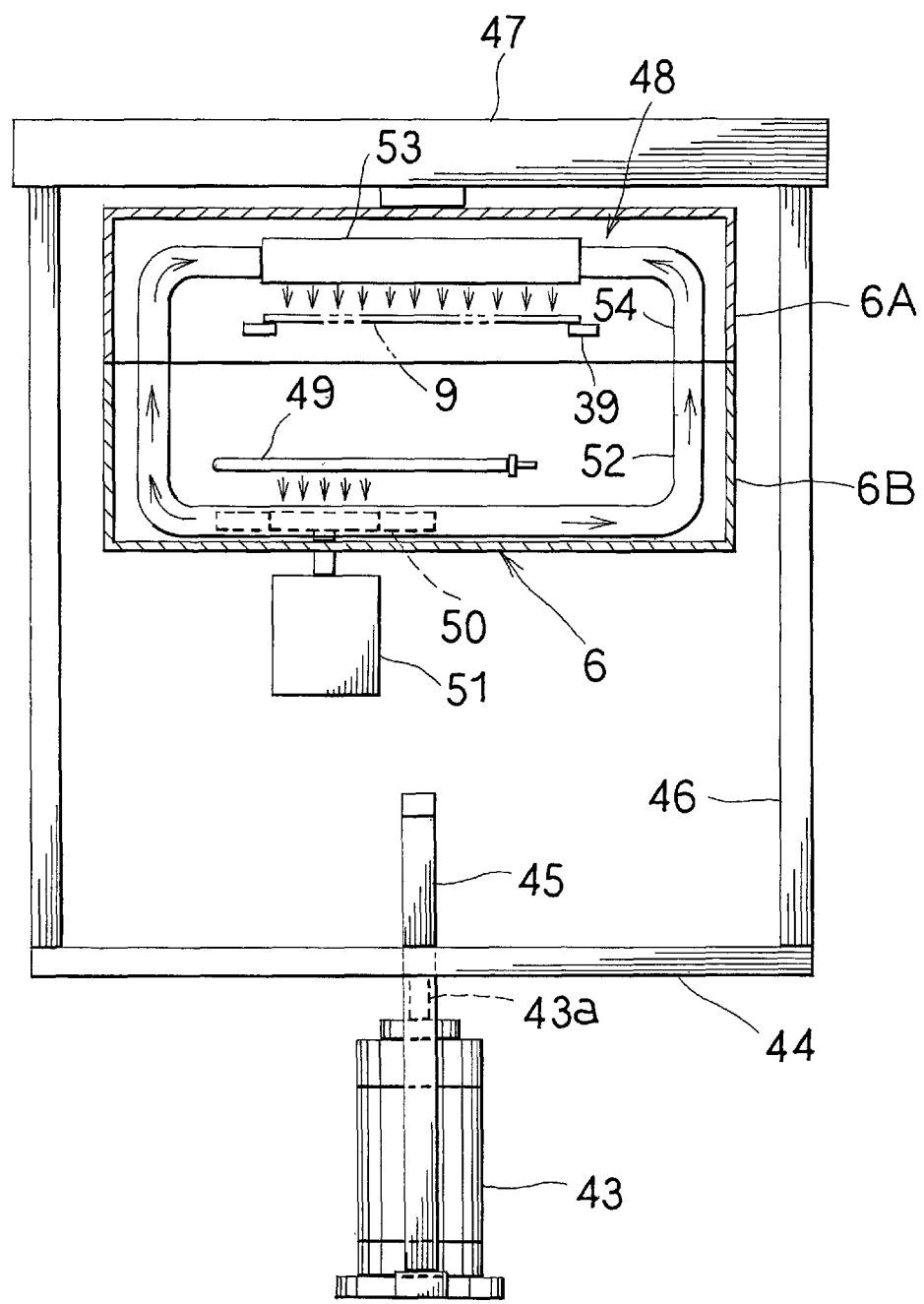
FIG. 10 is a longitudinal cross sectional view showing a sealingly closed state of the pressure reducing chamber.
Figure 11:
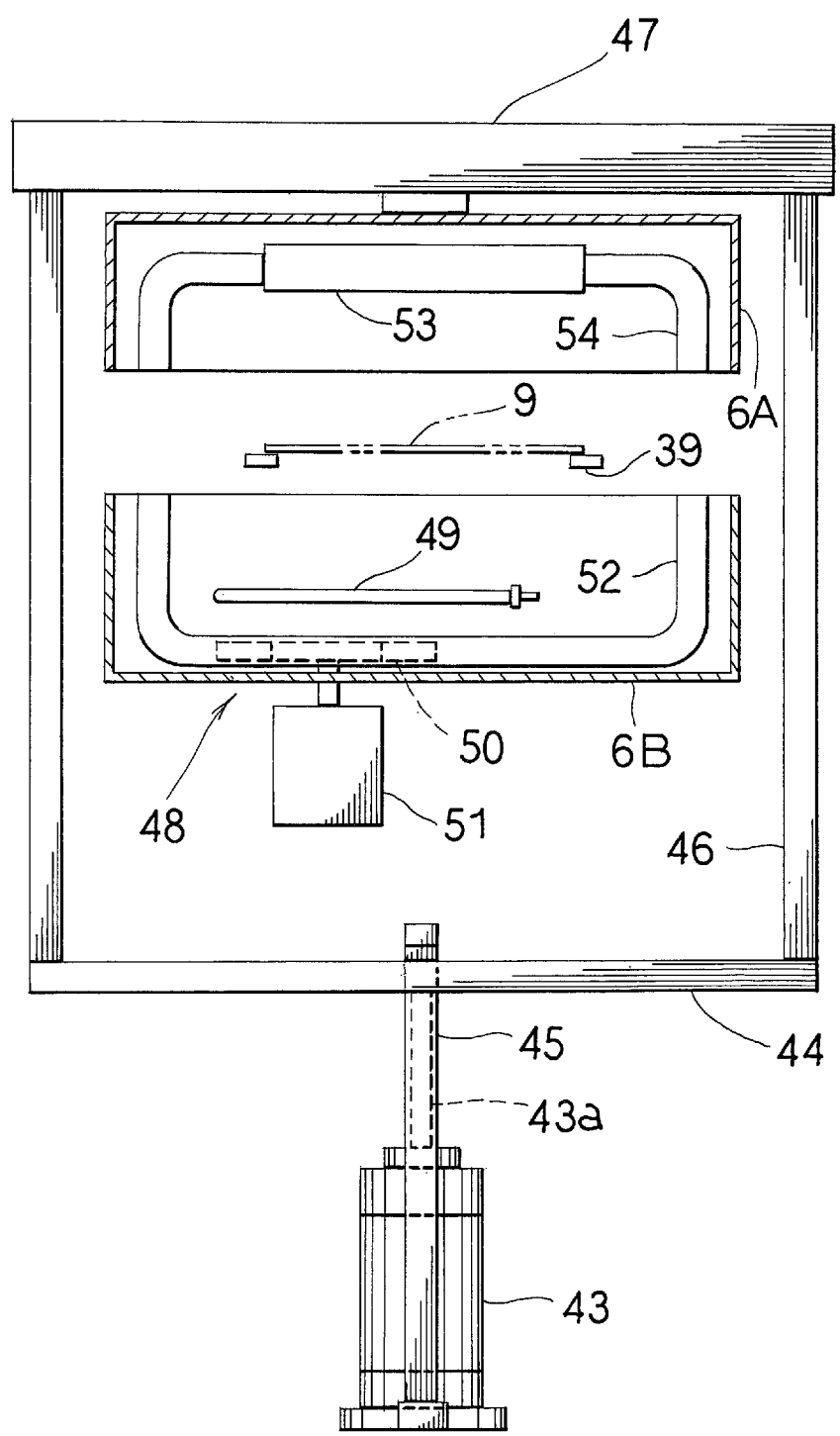
FIG. 11 is a longitudinal cross sectional view showing a opened state of the pressure reducing chamber.
Figure 12:
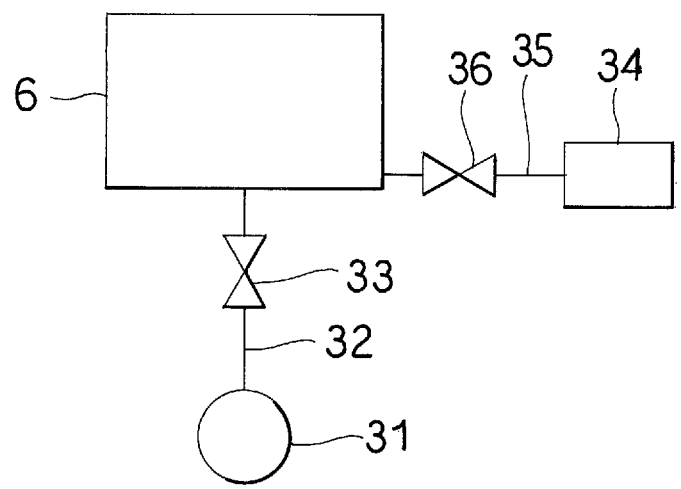
FIG. 12 is a view showing connecting component among the pressure reducing chamber, nitrogen gas feeding source and a vacuum pump.

In the case that the printed circuit board 9 is moved to and mounted on the board transferring conveyors 39 within the pressure reducing chamber 6 and it is set at the predetermined position within the pressure reducing chamber 6 by the board transferring conveyors 39, the upper housing 6A is moved downward by the cylinder device 43 and closely contacted with the lower housing 6B, and the pressure reducing chamber 6 is sealingly closed (refer to FIG. 10).

Since the heating atmospheric gas circulated within the reflow chamber 3B heats the peripheral walls of the pressure reducing chamber 6, the atmospheric gas in the pressure reducing chamber 6 is entirely heated through the peripheral walls. Due to this fact, the printed circuit board 9 processed in the pressure reducing chamber 6 is heated entirely and uniformly by the heating atmospheric gas within the pressure reducing chamber 6.

Further, the atmospheric gas heated by the heater 49 within the pressure reducing chamber 6 is sucked into the fan 50, blown out and circulates within the chamber. The printed circuit board 9 with the electronic components on the board transferring conveyors 39 is heated by the heating atmospheric gas blown out of the heated gas injection ports of the heated gas injection casing member 53.

Accordingly, the soldering part on the printed circuit board 9 with the electronic components is heated and melted within the last reflow chamber 3B and further, it is heated for a predetermined time within the pressure reducing chamber 6.

After this operation, the releasing valve 36 is closed and at the same time, the opening/closing valve 33 on the connecting line 32 in the vacuum pump 31 is released and the vacuum pump 31 is operated. With the foregoing, the nitrogen gas within the pressure reducing chamber 6 is discharged by the vacuum pump 31 up to a state in which it becomes predetermined vacuum atmosphere.

The pressure reducing chamber 6 is kept for the predetermined time with the predetermined reduced pressure atmosphere capable of carrying out removing of gas at the soldering part, and the printed circuit board 9 is processed with the gas is removed within the pressure reducing chamber 6 for the predetermined time.

After this operation, the opening/closing valve 33 is closed, the releasing valve 36 is released to open and the nitrogen gas is supplied from the nitrogen gas feeding source 34 into the pressure reducing chamber 6. Then, the upper housing 6A is moved upwardly by the cylinder device 43 and spaced apart in respect to the lower housing 6B and arranged above it (refer to FIG. 11), thereafter the printed circuit board 9 is moved by the board transferring conveyors 39 from the pressure reducing chamber 6 and mounted on the board transferring conveyors 38, the printed circuit board 9 is passed from the reflow chamber 3B through the cooling chamber 4 under an operation of the board transferring conveyors 38 and transferred to the outlet.

As described above, the printed circuit board 9 with the electronic components is heated while being transferred within the furnace 1, wherein the cream-like solder on the printed circuit board is heated at the preheating chambers 2A, 2B, 2C up to a predetermined temperature, wherein the soldering part is heated and melted at the first reflow chamber 3A, further, heated and melted within the last reflow chamber 3B and the pressure reducing chamber 6 and at the same time the gas is removed at the pressure reducing chamber 6. After this operation, the melted soldering part on the printed circuit board 9 is cooled and solidified at the cooling chamber 4 and the electronic components are soldered on the board.

Further, although the aforesaid preferred embodiment preferred embodiment has shown the example in which the fan within the reflow chamber where the pressure reducing chamber is present and the motor for driving the fan are positioned at the upper side of the reflow chamber, and the pressure reducing chamber, the fan within the pressure reducing chamber and the motor for driving the fan are positioned at the lower part of the reflow chamber, however, this invention is not restricted to the preferred embodiment and their arrangement can be installed in upside-down state. That is, it is also possible that the fan within the reflow chamber where the pressure reducing chamber is present and the motor are positioned at the lower side of the reflow chamber, and the pressure reducing chamber, the fan within the pressure reducing chamber and the motor are positioned at the upper part of the reflow chamber.

In addition, although the aforesaid preferred embodiment has disclosed the example in which the pressure reducing chamber is provided within the heating chamber, this invention is not restricted to this preferred embodiment, but it is preferable that the pressure reducing chamber is provided in the midway part of the transferring line of the board. For example, it may be provided between one heating chamber and the other heating chamber (for example, between one reflow chamber and the other reflow chamber)

In addition, the method for heating the board within the pressure reducing chamber is not restricted to the example shown in the preferred embodiment, but a far-infrared ray heater, for example, may be installed within the pressure reducing chamber.

In addition, although the aforesaid preferred embodiment has disclosed the example in which the nitrogen gas is used as the gas within the furnace, the gas is not restricted to this preferred embodiment. For example, the air is used instead of the nitrogen.

DESCRIPTION OF REFERENCE NUMERALS

1 furnace
2A preheated chamber
2B preheated chamber
2C preheated chamber
3A reflow chamber
3B reflow chamber
4 cooling chamber
5 partition walls
6 pressure reducing chamber
6A upper housing
6B lower housing
7 board transferring conveyors
8 board transferring conveyors
9 printed circuit board
12 fans
13 motors
14 heaters
15a roller link plate
15b roller
16a pin link plate
16b connector pin
17 guiding rails
17a horizontal rails
17b vertical plate member
18 guiding rails
18b vertical plate member
19 board supporting rails
19a horizontal rails
19b vertical plates
20 supporting rods
21 shutters
22 opening components
23 cylinder device
24 rail connector member
24a connector piece
25 first transfer means
26 pushing part
27 cylinder device
28 second transfer means
29 pushing part
30 cylinder device
31 vacuum pump
32 connecting line
33 opening/closing valve
34 Nitrogen gas feeding source
35 connecting line
36 releasing valve
37 board transferring conveyors
38 board transferring conveyors
39 board transferring conveyors
40 gas guiding device
41 heated gas circulation device 42 gas guiding cover
43 cylinder device
43a forwarding/retracting rod
44 supporting plate member
45 columns
46 columns
47 connecting plate member
48 heated gas circulation device
49 heater
50 fan
51 motor
52 gas guiding duct
53 heated gas injection casing member
54 gas guiding duct
55 cool gas circulation devices

The invention claimed is:

1. A reflow soldering apparatus for soldering electronic components mounted on a board by circulating atmospheric gas heated in a furnace while transferring the board with the electronic components in the furnace, comprising: a transferring line for providing the board is provided with a pressure reducing chamber capable of reducing a pressure of the atmospheric gas, and gas involved in a heated and melted soldering, part on the board is removed in the pressure reducing chamber, wherein a heating chamber has a heater and a blowing means, and the atmospheric gas heated by the heater circulates within the chamber through the blowing means driven by a motor arranged outside the heating chamber, and further wherein the pressure reducing chamber has a heater and a blowing means, and the atmospheric gas heated by the heater circulates within the chamber through the blowing means driven by a motor arranged outside the heating chamber.

2. The reflow soldering apparatus according to claim 1, wherein the pressure reducing chamber is arranged within a heating chamber where the heated atmospheric gas circulates.

3. The reflow soldering apparatus according to claim 1, wherein the pressure reducing chamber has a heated gas injecting means for blowing out the heated atmospheric gas to the board and a gas guiding duct for connecting a discharging port of the blowing means with the heated gas injecting means.

4. The reflow soldering, apparatus according to claim 1, wherein the motor for driving the blowing means in the heating chamber and the motor for driving the blowing means in the pressure reducing chamber are arranged oppositely at the upper surface and the lower surface of the heating chamber.

5. The reflow soldering apparatus according to claim 1, wherein there are provided board transferring conveyors arranged from an inlet side of the furnace up to a position just before the pressure reducing chamber, board transferring conveyors arranged in the pressure reducing chamber and board transferring conveyors arranged from a position just after the pressure reducing chamber up to an outlet of the furnace.

6. The reflow soldering apparatus according to claim 1, wherein there are provided board transferring conveyors arranged from an inlet side of the furnace up to a position just before the pressure reducing chamber, a transfer means for transferring the board on the board transferring conveyors into the pressure reducing chamber, board transferring conveyors arranged from a position just after the pressure reducing chamber up to an outlet of the furnace, and a transfer means for transferring the board within the pressure reducing chamber to the board transferring conveyors.

7. A fellow soldering method for soldering electronic components mounted on a board, comprising:
circulating heated atmospheric gas in a furnace while transferring the board with the electronic components in the furnace;
providing a pressure reducing, chamber capable of reducing a pressure of the atmospheric gas with a transferring line of the board; and
removing in the pressure reducing chamber gas involved in a heated and melted soldering part on the board, wherein a heating chamber has a heater and a blowing means, and the atmospheric gas heated by the heater circulates within the chamber through the blowing means driven by a motor arranged outside the heating chamber, and further wherein the pressure reducing chamber has a heater and a blowing means, and the atmospheric gas heated by the heater circulates within the chamber through the blowing means driven by a motor arranged outside the heating chamber.

8. The reflow soldering method according to claim 7, wherein the gas removing process is carried out after heating the board by circulating the heated atmospheric gas within the pressure reducing chamber.

* * * * *